(12) United States Patent
Yan et al.

(10) Patent No.: US 11,393,884 B2
(45) Date of Patent: Jul. 19, 2022

(54) PIXEL DEFINITION LAYER, ARRAY SUBSTRATE AND DISPLAY PANEL

(71) Applicant: BOE TECHNOLOGY GROUP CO., LTD., Beijing (CN)

(72) Inventors: Guang Yan, Beijing (CN); Chinlung Liao, Beijing (CN); Dongfang Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/181,773

(22) Filed: Nov. 6, 2018

(65) Prior Publication Data

US 2019/0157364 A1 May 23, 2019

(30) Foreign Application Priority Data

Nov. 23, 2017 (CN) .......................... 201711180407.7

(51) Int. Cl.
*H01L 27/32* (2006.01)
*H01L 51/52* (2006.01)
*H01L 51/50* (2006.01)

(52) U.S. Cl.
CPC ...... *H01L 27/3246* (2013.01); *H01L 27/3283* (2013.01); *H01L 51/5036* (2013.01); *H01L 51/5056* (2013.01); *H01L 51/5072* (2013.01); *H01L 51/5088* (2013.01); *H01L 51/5092* (2013.01); *H01L 51/5209* (2013.01); *H01L 51/5225* (2013.01); *H01L 51/5265* (2013.01); *H01L 2251/558* (2013.01)

(58) Field of Classification Search
CPC ............ H01L 27/3246; H01L 51/5036; H01L 27/3211
See application file for complete search history.

(56) References Cited

U.S. PATENT DOCUMENTS

| 8,309,947 | B2 | 11/2012 | Vaufrey |
| 9,450,028 | B2 | 9/2016 | Chou et al. |
| 10,204,968 | B2 | 2/2019 | Hou et al. |
| 10,347,861 | B2 | 7/2019 | Tang et al. |
| 2010/0181559 | A1* | 7/2010 | Nakatani ............. H01L 27/3283 257/40 |
| 2011/0198596 | A1* | 8/2011 | Park .................... H01L 27/3246 257/59 |

(Continued)

FOREIGN PATENT DOCUMENTS

| CN | 105118845 A | 12/2015 |
| CN | 106601775 A | 4/2017 |

OTHER PUBLICATIONS

First Office Action dated Nov. 11, 2019 for corresponding Chinese application 201711180407.7.

*Primary Examiner* — Samuel A Gebremariam
*Assistant Examiner* — Jonas T Beardsley
(74) *Attorney, Agent, or Firm* — Nath, Goldberg & Meyer; Joshua B. Goldberg

(57) ABSTRACT

A pixel definition layer for defining a light emitting device, an array substrate and a display panel are provided. The pixel definition layer includes a plurality of recessed parts, each of the plurality of recessed parts includes a bottom and an entire sidewall extending upwards from the bottom; and at least one of the plurality of recessed parts has the entire sidewall provided with a position-limiting structure.

20 Claims, 3 Drawing Sheets

(56) References Cited

U.S. PATENT DOCUMENTS

| | | | |
|---|---|---|---|
| 2014/0117339 A1* | 5/2014 | Seo ..................... | H01L 27/3218 |
| | | | 257/40 |
| 2014/0306201 A1* | 10/2014 | Yamazaki ........... | H01L 27/3246 |
| | | | 257/40 |
| 2015/0044805 A1* | 2/2015 | Ishino ................. | H01L 27/3209 |
| | | | 438/46 |
| 2016/0276615 A1* | 9/2016 | Kitabayashi ........ | H01L 51/5265 |
| 2018/0358573 A1* | 12/2018 | Maeda ................ | H01L 51/5036 |
| 2019/0157362 A1* | 5/2019 | Rho .................... | H01L 51/5268 |

* cited by examiner

PIXEL DEFINITION LAYER, ARRAY SUBSTRATE AND DISPLAY PANEL

CROSS-REFERENCE TO RELATED APPLICATIONS

The present application claims the priority of the Chinese Patent Application No. 201711180407.7, filed on Nov. 23, 2017, the contents of which are incorporated herein in their entirety by reference.

TECHNICAL FIELD

The present disclosure relates to the field of display technology, and in particular, relates to a pixel definition layer, an array substrate and a display panel.

BACKGROUND

In recent years, as electronic product technology and extensive application thereof are improved, demand for a planar display having a smaller volume and consuming less power compared to a conventional display grows with each passing day. Among various planar displays, an organic light emitting device, due to its characteristics such as self light emission, high brightness, wide angle of view, high response speed and simple manufacturing process, undoubtedly will become the best option for a next generation planar display.

SUMMARY

The present disclosure provides a pixel definition layer for defining a light emitting device, including a plurality of recessed parts arranged in an array, each of which including a bottom and an entire sidewall extending upwards from the bottom, and at least one of the plurality of recessed parts has the entire sidewall provided with a position-limiting structure.

In an embodiment, the position-limiting structure includes a first inflexion point and a second inflexion point; and the first inflexion point and the second inflexion point divide the entire sidewall into a first sidewall extending upwards from the bottom to the first inflexion point, a second sidewall extending from the first inflexion point to the second inflexion point, and a third sidewall extending upwards from the second inflexion point.

In an embodiment, the second sidewall is parallel to a surface of the bottom.

In an embodiment, the first sidewall and the third sidewall have a same inclination with respect to the surface of the bottom.

In an embodiment, the plurality of recessed parts include at least one repetitive unit, each of which includes at least a first recessed part, a second recessed part and a third recessed part, the entire sidewalls of the first recessed part, the second recessed part and the third recessed part have a same height in a direction vertical to the surface of the bottom, and the entire sidewalls of the second recessed part and the third recessed part each are provided with the position-limiting structure.

In an embodiment, a height difference in the direction vertical to the surface of the bottom between the second sidewall of the second recessed part and the surface of the bottom is equal to a height difference in the direction vertical to the surface of the bottom between the second sidewall of the third recessed part and the surface of the bottom.

In an embodiment, the height difference is 1 µm.

In an embodiment, the entire sidewall of the first recessed part has a height of 1.5 µm in the direction vertical to the surface of the bottom.

In an embodiment, a height difference in the direction vertical to the surface of the bottom between the second sidewall of the second recessed part and the surface of the bottom is greater than a height difference in the direction vertical to the surface of the bottom between the second sidewall of the third recessed part and the surface of the bottom.

In an embodiment, the entire sidewall of the first recessed part is provided with the position-limiting structure, and a height difference in the direction vertical to the surface of the bottom between the second sidewall of the first recessed part and the surface of the bottom is greater than a height difference in the direction vertical to the surface of the bottom between the second sidewall of the second recessed part and the surface of the bottom, and/or a height difference in the direction vertical to the surface of the bottom between the second sidewall of the second recessed part and the surface of the bottom is greater than a height difference in the direction vertical to the surface of the bottom between the second sidewall of the third recessed part and the surface of the bottom.

In an embodiment, an included angle between the surface of the bottom and the entire sidewall is an acute angle.

The present disclosure further provides an array substrate, including a substrate and a pixel definition layer provided on the substrate, wherein, the pixel definition layer includes a plurality of recessed parts arranged in an array, each of which including a bottom and an entire sidewall extending upwards from the bottom, at least one of the plurality of recessed parts has the entire sidewall provided with a position-limiting structure; and the at least one of the plurality of recessed parts is provided with a light emitting device therein, and at least one of a plurality of functional layers of the light emitting device is provided below the position-limiting structure in the recessed part.

In an embodiment, the position-limiting structure includes a first inflexion point and a second inflexion point; and the first inflexion point and the second inflexion point divide the entire sidewall into a first sidewall extending upwards from the bottom to the first inflexion point, a second sidewall extending from the first inflexion point to the second inflexion point, and a third sidewall extending upwards from the second inflexion point.

In an embodiment, the second sidewall is parallel to a surface of the bottom.

In an embodiment, the plurality of recessed parts include at least one repetitive unit, each of which includes at least a first recessed part, a second recessed part and a third recessed part, and a red light emitting device, a green light emitting device, and a blue light emitting device are provided in the first recesses part, the second recessed part and the third recessed part, respectively, the entire sidewalls of the first recessed part, the second recessed part and the third recessed part have a same height in a direction vertical to the surface of the bottom, the first recessed part, the second recessed part, and the third recessed part, where the red light emitting device, the green light emitting device, and the blue light emitting device are respectively located, each are provided with the position-limiting structure, and a height difference in the direction vertical to the surface of the bottom between the second sidewall of the recessed part corresponding to the blue light emitting device and the surface of the bottom is lowest, and a height difference in the direction vertical to the surface of the bottom between the second sidewall of the recessed part corresponding to the red light emitting device and the bottom surface is highest; or the second recessed part and the third recessed part, where the green light emitting device and the blue light emitting device are respectively located, each are provided with the position-limiting structure, and the first recessed part, where the red light emitting device is located, is not provided with the position-limiting structure, and a height difference in the direction vertical to the surface of the bottom between the second sidewall of the recessed part corresponding to the blue light emitting device and the surface of the bottom is smaller than or equal to a height difference in the direction vertical to the surface of the bottom between the second sidewall of the recessed part corresponding to the green light emitting device and the surface of the bottom.

In an embodiment, each of the red light emitting device, the green light emitting device and the blue light emitting device includes a first electrode, a plurality of functional layers and a second electrode provided sequentially in the recessed part where the light emitting device is located; and the plurality of functional layers include a hole injection layer, a hole transport layer, a light emitting layer, an electron transport layer and an electron injection layer sequentially provided along a direction away from the first electrode.

In an embodiment, the plurality of functional layers of each of the red light emitting device, the green light emitting device and the blue light emitting device are all provided below the position-limiting structure in the recessed part where the light emitting device is located.

In an embodiment, a thickness of the hole transport layer of the red light emitting device is greater than a thickness of the hole transport layer of the green light emitting device, and a thickness of the hole transport layer of the green light emitting device is greater than a thickness of the hole transport layer of the blue light emitting device.

In an embodiment, a thickness of the light emitting layer of the red light emitting device is greater than a thickness of the light emitting layer of the green light emitting device, and a thickness of the light emitting layer of the green light emitting device is greater than a thickness of the light emitting layer of the blue light emitting device.

The present disclosure further provides a display panel, including the above array substrate.

DETAILED DESCRIPTION

Figure 1:
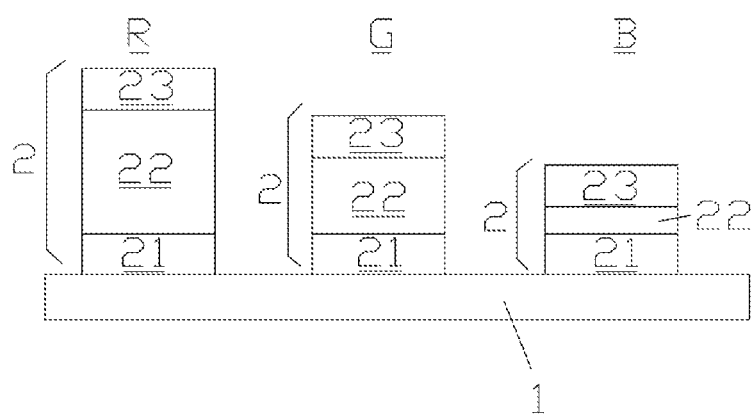
FIG. 1 is a schematic diagram of a structure of a light emitting device according to an embodiment of the present disclosure.

In order to improve the efficiency of preparing an OLED by a solution printing method, and to ensure the performance of a display, a light emitting position of the OLED is generally set at an antinode of a standing wave. The choice of the antinode of the standing wave will influence light emitting efficiency and yield of the device. In another aspect, to render characteristics of high utilization rate and low cost of the OLED material, some film layers of the OLED may be prepared by a solution printing method. In order to set the light emitting position of the OLED at the position of the antinode of the standing wave, the OLEDs with different colors may include at least one film layer having different thicknesses. When forming film layers having different thicknesses using the solution printing method, there is a problem of poor uniformity in film thickness for the film layers having different thicknesses. The bad uniformity in film thickness may influence a lifetime of the device.

For this reason, the present application proposes a pixel definition layer, an array substrate and a display panel, which not only can strengthen micro-cavity effect, and enhance the light emitting efficiency of the light emitting device while improving the yield of the light emitting device, but also can obtain the good uniformity in film thickness when forming film layers of the light emitting device, and in turn extend the lifetime of the device.

In order to allow one skilled in the art to better understand technical solutions of the present disclosure, the pixel definition layer according to the present disclosure is described in detail below in conjunction with the accompanying drawings.

An embodiment of the present disclosure provides a pixel definition layer for defining a light emitting device, including a plurality of recessed parts arranged in an array, each of which including a bottom and an entire sidewall extending upwards from the bottom, and at least one of the plurality of recessed parts has the entire sidewall provided with a position-limiting structure.

The above-described light emitting device may be an organic light emitting diode with an organic layer. According to electromagnetic theory, if the light emitting position of the light emitting device is set at the position of an antinode of a standing wave, the micro-cavity effect can be strengthened, and light emitting intensity can be enhanced, so that the light emitting efficiency of the organic light emitting device can be increased.

As described in further detail in the following, the light emitting device according to an embodiment of the present disclosure includes a first electrode provided on a substrate and a second electrode provided distal to the substrate. In an embodiment, the first electrode is a transparent electrode made of indium tin oxide, and the second electrode is a non-transparent electrode made of metal. In another embodiment, the first electrode and the second electrode may be made of different materials, which are not limited here. In this embodiment, a first antinode and a second antinode described herein are both positions defined relative to the first electrode. According to the above-described electromagnetic theory, a position of an antinode is proportional to a wavelength, that is, the longer the wavelength of light having a color, the farther apart from the first electrode is the light emitting position of the light emitting device which emits the light of that color.

In some existing organic light emitting devices, the light emitting position of the light emitting device is located at a position of the first antinode of a standing wave formed by the light of the color emitted from the device. Although this may increase intensity of light emission, yet, compared to other antinodes, the first antinode has the shortest light path from the first electrode of the light emitting device, which results in a relatively thin total thickness of the device and therefore possibility of electric leakage of the device, thereby affecting the device yield.

In the pixel definition layer according to an embodiment of the present disclosure, the light emitting position of the organic light emitting device is located at a position of the second antinode of a standing wave formed by the light of the color emitted from the device. According to standing wave theory and electromagnetic theory, in the embodiment, a distance from the $n^{th}$ antinode of a standing wave to the first electrode is proportional to n times of the wavelength. Since the distance from the second antinode to the first electrode is greater than the distance from the first antinode to the first electrode, the total thickness of the light emitting device is larger in a case where the light emitting position is located at the second antinode of the standing wave, than the total thickness of the light emitting device in a case where the light emitting position is located at the first antinode of the standing wave, thereby preventing electric leakage of the device. However, an excessively large total thickness of the light emitting device is not advisable (for example, the light emitting position located at a position of the third antinode or a position of another antinode which is even farther away from the first electrode), to prevent an excessively high voltage of the device which affects the device yield. Hence, when the light emitting position is located at a position of the second antinode of a standing wave, the total thickness of the light emitting device is optimal, in which case the light emitting intensity of the light emitting device is high, and it is possible to achieve a high device yield.

In practical applications, light emitting devices of different colors have different total thicknesses, such that the light emitting devices have respective light emitting positions, which are all located at positions of second antinodes of standing waves formed by light of respective colors emitted therefrom, respectively.

As described above, in order that each of the light emitting devices of different colors has a light emitting position located at the second antinode of a standing wave thereof the light emitting devices of different colors will have different total thicknesses, for example, as schematically illustrated in FIG. 1. On the other hand, an array substrate including an OLED light emitting device usually includes a red light emitting device, a green light emitting device and a blue light emitting device. These three types of light emitting devices of different colors have organic light emitting layers made of materials having different characteristics. Generally, a material for the organic light emitting layer of the red light emitting device has a good lifetime, a material for the organic light emitting layer of the green light emitting device has a poor lifetime, and a material for the organic light emitting layer of the blue light emitting device has the worst lifetime. In this case, if the organic light emitting layers have a same thickness, then, within one array substrate, the red light emitting device will have a lifetime longer than that of the green light emitting device, and the green light emitting device will have a lifetime longer than that of the blue light emitting device, which will cause non-uniformity of performances of light emitting devices over the entire array substrate. For this, the present disclosure proposes a scheme to unify lifetimes of light emitting devices of different colors on the entire display panel by employing light emitting layers having different thicknesses on the array substrate.

For organic light emitting layers, the larger the thickness, the poorer the uniformity, and the poor uniformity will further shorten the lifetime of the light emitting device.

Therefore, in order that the red light emitting device, the green light emitting device and the blue light emitting device on one array substrate have a uniform lifetime, generally the organic light emitting layer of the red light emitting device is arranged to have a largest thickness, and the organic light emitting layer of the blue light emitting device has a smallest thickness.

Figure 2:
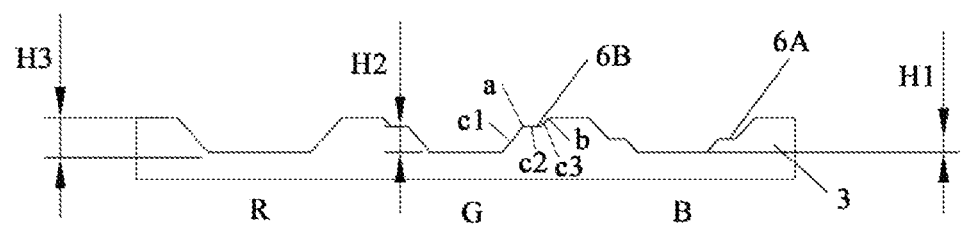
FIG. 2 is a schematic diagram of a pixel definition layer according to an embodiment of the present disclosure.

To this end, as shown in FIG. 2, the present disclosure proposes a pixel definition layer for defining light emitting devices, such that functional layers of each of the light emitting devices are arranged to not only satisfy the condition that a light emitting position of each of the light emitting devices is located at the above-described second antinode, but also cause light emitting layers of light emitting devices of different colors to have different thicknesses, so as to ensure that light emitting devices of different colors on the entire array substrate have a uniform performance.

FIG. 2 illustrates a schematic plan view of a pixel definition layer according to an embodiment of the present disclosure. As shown in FIG. 2, the pixel definition layer of the present disclosure includes a plurality of recessed parts arranged in an array, each of which including a bottom and an entire sidewall extending upwards from the bottom, and at least one of the plurality of recessed parts has the entire sidewall provided with a position-limiting structure.

As shown in FIG. 2, the position-limiting structure causes a sidewall, which is mostly smooth, to have a first inflexion point a and a second inflexion point b, so as to set and define a thickness of at least one functional layer of the light emitting device to be formed therein. As shown in FIG. 2, the first inflexion point a and the second inflexion point b divide the entire sidewall into a first sidewall c1 extending upwards from the bottom to the first inflexion point a, a second sidewall c2 extending from the first inflexion point a to the second inflexion point b, and a third sidewall c3 extending upwards from the second inflexion point b. In the example show in FIG. 2, the second sidewall c2 is parallel to the surface of the bottom, thus the position-limiting structure is configured to be a step structure 6A or 6B formed on the sidewall.

In the current application, an inflexion point refers to an unsmooth position in an entire surface which may divide the entire surface into two smooth planes, and the inflexion point is located at a junction between the two smooth planes.

FIG. 2 shows three recessed parts, and this group of three continuous recessed parts constitutes one repetitive unit, in which the three recessed parts may correspond to a red light emitting device, a green light emitting device and a blue light emitting device, respectively.

Figure 3:
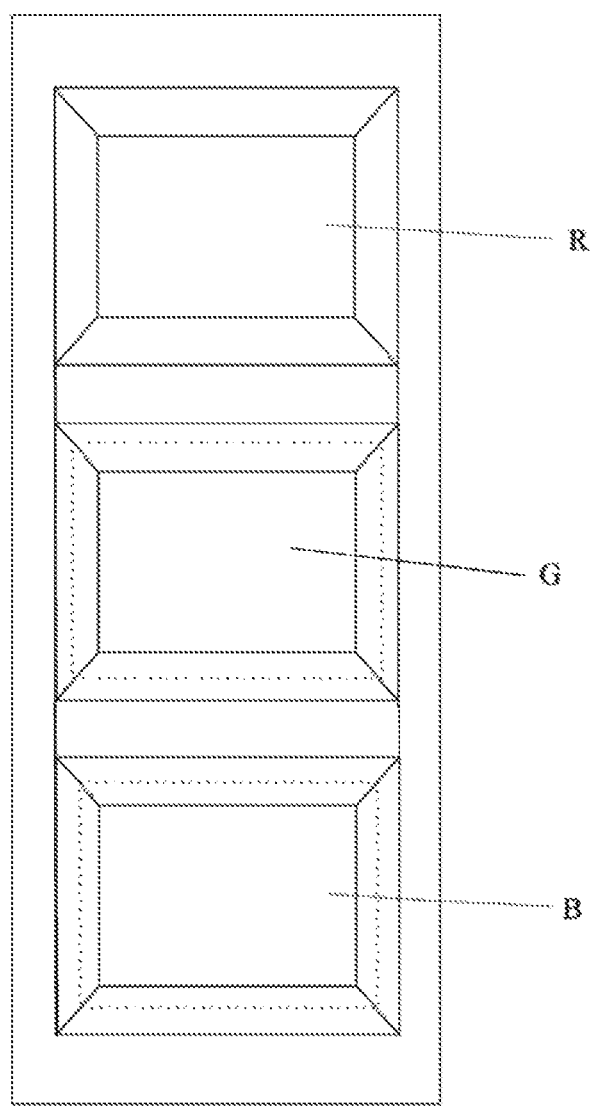
FIG. 3 is a plan view of the pixel definition layer of FIG. 2.

FIG. 3 is a schematic plan view schematically illustrating the pixel definition layer of FIG. 2, and the dotted lines in the recessed parts for the green light emitting device and the blue light emitting device are drawn for illustrating that there are step structures in the recessed parts, respectively. In actual situations, the pixel definition layer 3 is provided with a plurality of recessed parts, and light emitting devices are one-to-one correspondingly provided in the recessed parts, respectively. At least one recessed part has a step structure at its sidewall, and the step structure acting as the position-limiting structure as shown in FIG. 2 may be used, when forming a light emitting device in the recessed part by employing solution process, to define a total thickness of the solution for forming a film layer of the light emitting device provided in the recessed part where the step structure is located, and accordingly to define thicknesses of functional layers of the light emitting device. Generally, a light emitting device is formed of multiple film layers (for example, including a hole injection layer, a hole transport layer, a light emitting layer and the like, as described below), and light emitting devices of different colors may have at least one film layer of different thicknesses. In a general case, when forming a film layer of a light emitting device employing solution process, the larger the thickness of the film layer, the larger the total thickness of the solution in the recessed part, accordingly, the higher the height of the pixel definition layer for defining the thickness of the solution (for example, a height H3 of the entire sidewall corresponding to the recessed part of the red light emitting device shown in FIG. 2). However, research shows that, in a certain range in film thickness, a lower height of the pixel definition layer can achieve better uniformity of film thickness. If a thickness of solution for forming a thin film layer and a thickness of solution for forming a thick film layer are both defined by one pixel definition layer, then in order to form the thick film layer, the height of the pixel definition layer will be high, which, when forming the thin film layer, will unfavorably cause poor uniformity of film thickness of this thin film layer, finally effecting the lifetime of the device. According to an embodiment of the present disclosure, by providing a step structure in at least one recessed part of the pixel definition layer, and when forming a thin film layer employing solution process, by providing a low step structure, the step structure can limit the thickness of the solution within the height of the step structure, thereby increasing uniformity of film thickness and extending lifetime of the device.

In the embodiment shown in FIG. 2, three continuous recessed parts in the pixel definition layer are illustrated, which can serve as a repetitive unit, and a red light emitting device R, a green light emitting device G and a blue light emitting device B can be provided therein, respectively. Step structures 6B and 6A are provided in recessed parts where the green light emitting device G and the blue light emitting device B are located. Since the blue light emitting device B has the shortest wavelength of a standing wave, and the red light emitting device R has the longest wavelength of a standing wave, according to the above described electromagnetic theory, the red light emitting device R's second antinode is farthest away from the first electrode, and the blue light emitting device B's second antinode is closest to the first electrode. Therefore, the red light emitting device R has the largest total thickness, and the blue light emitting device B has the smallest total thickness. Accordingly, at least one film layer of the red light emitting device R may have a larger thickness, and a film layer of the blue light emitting device B may have a smaller thickness. Therefore, a height H1 of the step structure 6A corresponding to the blue light emitting device B is lower than a height H2 of the step structure 6B corresponding to the green light emitting device (G thereby causing a maximum total thickness of the blue light emitting device B to be smaller than a maximum total thickness of the green light emitting device G. Since no step structure is provided in the recessed part where the red light emitting device R is located, the height H3 of this recessed part is a maximum total thickness of the red light emitting device R, thus, the red light emitting device R has the largest total thickness. By this, different total thicknesses of the red light emitting device R, the green light emitting device G and the blue light emitting device B can be achieved. The maximum total thickness of the light emitting device refers to a sum of maximum thicknesses achievable in recessed part for film layers of the light emitting device.

In another aspect, since a light emitting layer of a red light emitting device has a longer lifetime compared to light emitting layers of a green light emitting device and a blue light emitting device, it is required to set the light emitting layer of the blue light emitting device to be thinner and more uniform. Therefore, the step structure 6A of the recessed part corresponding to the blue light emitting device B has the smallest vertical height difference H1 (which can be called a height of the step structure and is a vertical difference between the sidewall c2 (i.e. a flat portion of the step structure) and the bottom in the direction vertical to the surface of the bottom, for short) from the bottom corresponding thereto, the step structure 6B of the recessed part corresponding to the green light emitting device G has a higher vertical height difference H2 from the bottom corresponding thereto.

It is to be noted that, in this embodiment, no step structure is provided in the recessed part where the red light emitting device R is located, but the present disclosure is not limited thereto. In practical applications, step structures may be provided in recessed parts where the red light emitting device R, the green light emitting device G and the blue light emitting device B are located, respectively, and the step structure corresponding to the blue light emitting device B may have the lowest height, the step structure corresponding to the red light emitting device R may have the highest height, which can also achieve total thicknesses of the red light emitting device R, the green light emitting device G and the blue light emitting device B different from each other.

Needless to say, to simplify the fabrication procedure, the step structure in the recessed part corresponding to the blue light emitting device and the step structure in the recessed part corresponding to the green light emitting device may be set to have the same height, and there may be no step structure in the recessed part corresponding to the red light emitting device. At this time, the height H1 of the step structure 6A equals to the height H2 of the step structure 6B, for example, the height H1 or the height H2 may be 1 μm; the height H3 of the recessed part corresponding to the red light emitting device R may be, for example, 1.5 μm.

As shown in FIG. 2, in the pixel definition layer of the present disclosure, a sidewall in each recessed part may make an acute included angle with the bottom.

A specific structure of each light emitting device is described in detail below. Specifically, as shown in FIG. 1, each light emitting device 2 includes a first electrode 21, which is disposed on a substrate 1; a light emitting function layer 22, which is disposed on the first electrode 21; and a second electrode 23, which is disposed on the light emitting function layer 22.

The light emitting function layer 22 usually includes a hole injection layer, a hole transport layer, a light emitting layer, an electron transport layer and an electron injection layer sequentially disposed along a direction pointing away from the first electrode 21, and the light emitting layer is located at the light emitting position.

Generally, the hole transport layer is used as a light emitting position adjusting layer, and by adjusting a thickness of the light emitting position adjusting layer, a total thickness of the light emitting device 2, that is, a sum of thicknesses of the first electrode 21, the light emitting function layer 22 and the second electrode 23, can be adjusted, such that the light emitting position of the light emitting device 2 is located at a position of a second antinode of a standing wave formed by the light of the color emitted therefrom.

Since the hole transport layer has a conductivity higher than other layers, even if the thickness of the hole transport layer is thick, it will not cause an excessively high resistance. In this embodiment, the light emitting devices of different colors have first electrodes of a same thickness, hole injection layers of a same thickness, electron transport layer of a same thickness, electron injection layers of a same thickness and second electrodes of a same thickness. In this embodiment, the hole transport layer of the red light emitting device may have a thickness greater than the hole transport layer of the green light emitting device, and the hole transport layer of the green light emitting device may have a thickness greater than the hole transport layer of the blue light emitting device. In the embodiment, the light emitting layer of the red light emitting device may have a thickness greater than the light emitting layer of the green light emitting device, and the light emitting layer of the green light emitting device may have a thickness greater than the light emitting layer of the blue light emitting device.

Figure 4:
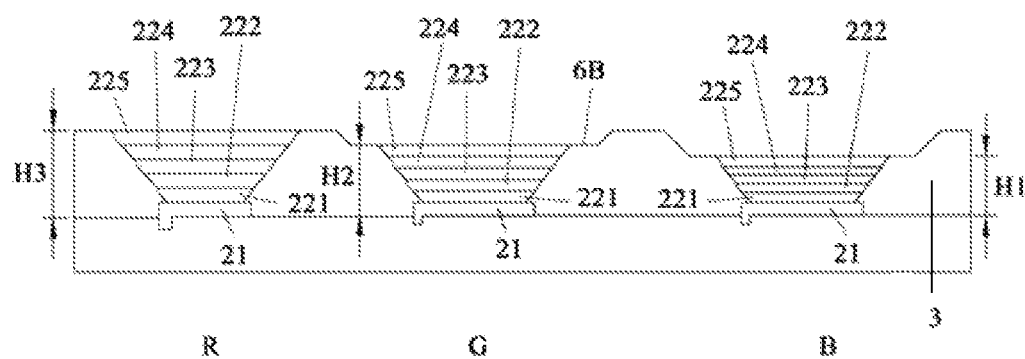
FIG. 4 illustrates a schematic diagram of a structure of an array substrate according to an embodiment of the present disclosure.
Figure 5:
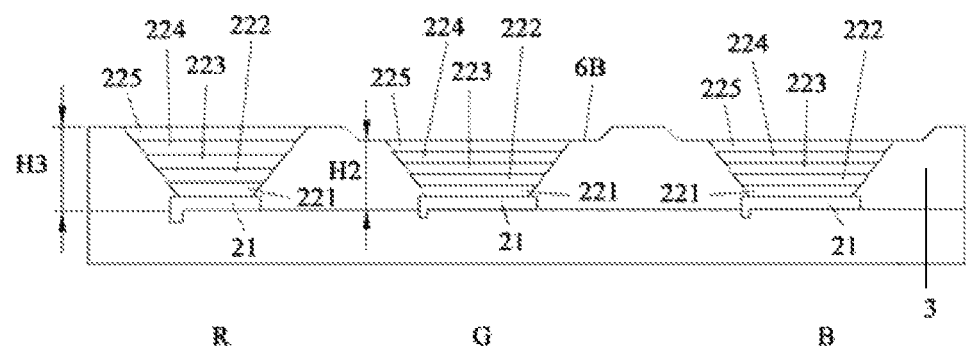
FIG. 5 illustrates a schematic diagram of a structure of an array substrate according to an embodiment of the present disclosure.

In order that the light emitting layers of the light emitting devices of different colors on the array substrate have a uniform lifetime and in order to ensure that light emitting positions of the light emitting devices are located at positions of second antinodes of standing waves formed by light emitted therefrom, respectively, the array substrate of the present disclosure includes the pixel definition layer as shown in FIG. 2, for example, as shown in FIGS. 4 and 5.

In FIG. 4, recessed parts corresponding to the red light emitting device R, the green light emitting device G and the blue light emitting device B each is provided with a first electrode layer 21, a hole injection layer 221, a hole transport layer 222, a light emitting layer 223, an electron transport layer 224 and an electron injection layer 225. As shown in FIG. 4, a total thickness of the first electrode layer and the five functional layers corresponding to the red light emitting device R is H3, a total thickness of the first electrode layer and the five functional layers corresponding to the green light emitting device G is H2, and a total thickness of the first electrode layer and the five functional layers corresponding to the blue light emitting device B is H1. As shown in the figure, functional layers corresponding to the red light emitting device R are all provided in the recessed part, and there is no step structure on the sidewall of this recessed part. Functional layers corresponding to the green light emitting device G and the blue light emitting device B are all provided below step structures corresponding to the recessed parts, respectively.

The present disclosure is not limited thereto. The total thickness as described above of the first electrode layer and the functional layers corresponding to the red light emitting device R may be smaller than H3. The total thicknesses as described above of the first electrode layer and the functional layers corresponding to the green light emitting device G and the blue light emitting device B may be respectively smaller than H2 and H1, i.e. the heights of the step structures in recessed parts corresponding thereto, respectively.

Further, FIG. 5 illustrates an array substrate in which step structures of recessed parts for the green light emitting device G and the blue light emitting device B have a same height. In this embodiment, the height H2 for the green and blue light emitting devices, for example, may be 1 μm, and the height H3 for the red light emitting device may be 1.5 μm.

Figure 6:
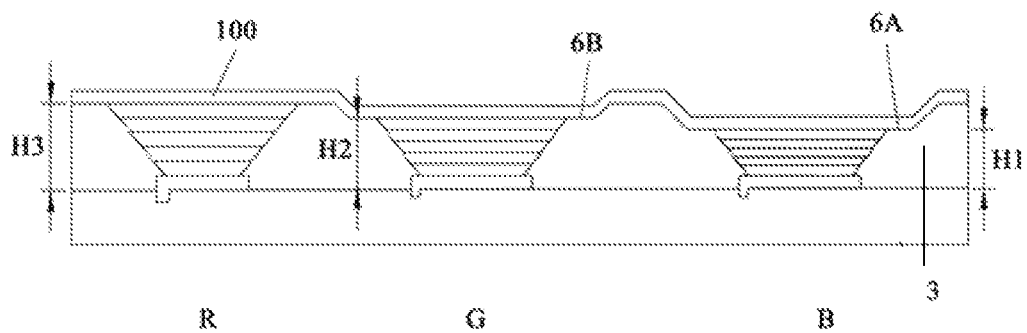
FIG. 6 illustrates a schematic diagram of a structure of an array substrate according to an embodiment of the present disclosure.

Further, FIG. 6 illustrates an array substrate in which a second electrode 100 is formed on the top of the pixel definition layer.

Table 1 below is an example of thicknesses of light emitting functional layers of the red light emitting device R, the green light emitting device G and the blue light emitting device B. Thicknesses of the first electrodes 21 of the three light emitting devices are all 50 nm; thicknesses of the hole injection layers of the three light emitting devices are all 100 nm; thicknesses of the electron transport layers of the three light emitting devices are all 20 nm; thicknesses of the electron injection layers of the three light emitting devices are all 1 nm; thicknesses of the second electrodes 23 of the three light emitting devices are all 150 nm. Thicknesses of the hole transport layer and the light emitting layer of the red light emitting device R are 175 nm and 64 nm, respectively; thicknesses of the hole transport layer and the light emitting layer of the green light emitting device G are 125 nm and 60 nm, respectively; thicknesses of the hole transport layer and the light emitting layer of the blue light emitting device B are 105 nm and 38 nm, respectively. It can be seen that, a thickness of the hole transport layer may be selected after thicknesses of other film layers are determined, to control the total thickness of the light emitting device, such that the light emitting positions of the light emitting devices of different colors can all be located at positions of the second antinodes of the standing waves thereof.

TABLE 1

| Red light emitting device R | Green light emitting device G | Blue light emitting device B |
| --- | --- | --- |
| Metal electrode: 150 nm | Metal electrode: 150 nm | Metal electrode: 150 nm |
| Electron injection layer: 1 nm | Electron injection layer: 1 nm | Electron injection layer: 1 nm |
| Electron transport layer: 20 nm | Electron transport layer: 20 nm | Electron transport layer: 20 nm |
| Light emitting layer (red): 64 nm | Light emitting layer (green): 60 nm | Light emitting layer (blue): 38 nm |
| Hole transport layer: 175 nm | Hole transport layer: 125 nm | Hole transport layer: 105 nm |
| Hole injection layer: 100 nm | Hole injection layer: 100 nm | Hole injection layer: 100 nm |

ITO (50 nm)

It is to be noted that, in this embodiment, the hole transport layer serves as a light emitting position adjusting layer, such that the light emitting position of the light emitting layer is located at the second antinode, but the present disclosure is not limited thereto. In another embodiment, the hole injection layer may be used as the light emitting position adjusting layer, or the hole injection layer and the hole transport layer may together serve as the light emitting position adjusting layer.

It is further to be noted that, in this embodiment, at least one group of light emitting devices are included, and each group of light emitting devices include three light emitting devices, which are the red light emitting device R, the green light emitting device G and the blue light emitting device B. However, the present disclosure is not limited thereto. The group of light emitting devices may include light emitting devices of any number of colors. For example, each group of light emitting devices may include light emitting devices of four or more colors, which may be a red light emitting device, a green light emitting device, a blue light emitting device and a white light emitting device.

In conclusion, in the array substrate according to an embodiment of the present disclosure, the light emitting position of the light emitting device is located at a position of a second antinode of a standing wave formed by the light of the color emitted therefrom, which can strengthen microcavity effect, enhance light emitting intensity, and increase the light emitting efficiency of the light emitting device. At the same time, by setting the light emitting position of the light emitting device at the second antinode of the standing wave, the total thickness of the light emitting device can be prevented from being too thin or too thick, thereby preventing electric leakage of the device due to too thin thickness or voltage rise due to too thick thickness, and in turn improving the yield of the device.

With the above described step structure of the pixel definition layer, it is possible to set the functional layers of the light emitting device at particular positions, ensure that thicknesses of light emitting layers of light emitting devices are set according to characteristics of light emitting layers of different colors, and unify lifetimes of light emitting layers of light emitting devices of different colors included in the array substrate.

For example, when fabricating the above described light emitting device 2 by employing solution process (for example, spin coating, inkjet printing, nozzle coating and the like), a height of a solution containing solute can be lower than or equal to the height defined by the step structure, and the solute is used for forming film layers of the light emitting device, so not only that a light emitting device having a relatively thick film layer can be formed, but also a relatively thin film layer can have a better uniformity in film thickness, thereby improving the yield of the device.

In an embodiment, a pattern of the pixel definition layer is formed by one step employing a halftone mask. That is, a recessed part and a step structure thereon of the pixel definition layer are formed simultaneously by one process, so as to reduce complexity of the fabrication procedure.

In the array substrate according to the present disclosure, a light emitting position of a light emitting device of an organic light emitting device is located at a position of a second antinode of a standing wave formed by the light of the color emitted therefrom. According to electromagnetic theory, if a light emitting position of a light emitting device is set at an antinode of a standing wave, micro-cavity effect can be strengthened, to enhance light emitting intensity, and therefore the light emitting efficiency of the light emitting device can be increased. At the same time, by setting the light emitting position of the light emitting device at the second antinode of the standing wave, the total thickness of the light emitting device can be prevented from being too thin or too thick, thereby preventing electric leakage of the device due to too thin thickness or voltage rise due to too thick thickness, and in turn improving the yield of the device.

Furthermore, in the array substrate according to the present disclosure, by setting step structures of different heights for light emitting devices of different colors, one can not only achieve a relatively thick film layer so that the light emitting position can be located at a position of second antinode of a standing wave, but also cause a relatively thin film layer to have a better uniformity in film thickness, thereby improving the lifetime of the device.

It can be understood that, the above embodiments are only exemplary embodiments for the purpose of explaining the principle of the present disclosure, and the present disclosure is not limited thereto. For one of ordinary skill in the art, various improvements and modifications may be made without departing from the spirit and essence of the present disclosure. These improvements and modifications also fall within the protection scope of the present disclosure.

What is claimed is:

1. A pixel definition layer, as a single layer, for defining a plurality of light emitting devices, comprising a plurality of recessed parts arranged in an array, each of which comprising a bottom and an entire sidewall extending upwards from the bottom to an upper surface of the pixel definition layer, wherein
at least two recessed parts of the plurality of recessed parts are different from each other to accommodate light emitting device of different colors respectively,
the entire sidewall of at least one of the at least two recessed parts has a position-limiting structure on the entire sidewall,
the position-limiting structure comprises a bottom inflexion point at a junction of the bottom and the entire sidewall, and a first inflexion point and a second inflexion point on the entire sidewall, and the bottom inflexion point is lower than the first inflexion point, and the first inflexion point is lower than the second inflexion point relative to the bottom or the first inflexion point is at a same height as the second inflexion point relative to the bottom,
the first inflexion point and the second inflexion point divide the entire sidewall into a first flat sub-sidewall extending upwards from the bottom to the first inflexion point, a second flat sub-sidewall extending from the first inflexion point to the second inflexion point, and a third flat sub-sidewall extending upwards from the second inflexion point to the upper surface of the pixel definition layer, a first obtuse inner angle is formed between the first flat sub-sidewall and the second flat sub-sidewall, and a second obtuse inner angle is formed between the second flat sub-sidewall and the third flat sub-sidewall, and
the position-limiting structure is configured to limit a plurality of functional layers of the light emitting device to be in the recessed part and below the first inflexion point; and
the plurality of functional layers comprise a hole injection layer, a hole transport layer, a light emitting layer, an electron transport layer and an electron injection layer;
orthographic projections of the first flat sub-sidewall and the second flat sub-sidewall on a plane, which includes the bottom of the recess, are jointed at a first jointing line, and orthographic projections of the second flat sub-sidewall and the third flat sub-sidewall on the plane are jointed at a second jointing line, and the first jointing line is separated from the second jointing line;
an upper surface of the plurality of functional layer is flush with the first inflexion point, all the plurality of functional layers of the light emitting devices of different colors are all limited in the plurality of recessed parts, respectively, and lower surface of the plurality of functional layers of the light emitting devices of different colors are respectively in direct contact with the bottoms of the plurality of recessed parts, these bottoms are at a same height, and all the upper surfaces of the plurality of functional layers of the light emitting devices of different colors are at different heights; and
the at least two recessed parts for accommodating light emitting devices of different colors comprise a first recessed part which is not provided with the position-limiting structure on its entire sidewall and its entire sidewall is a flat sidewall extending from the bottom to the upper surface and an upper surface of the functional layers of the light emitting device in the first recessed part is flush with the upper surface of the pixel definition layer, and a second recessed part which is provided with the position-limiting structure on its entire sidewall, and the first inflexion point of the second recessed part is lower than the upper surface.

2. The pixel definition layer according to claim 1, wherein the first inflexion point is at a same height as the second inflexion point relative to the bottom, the second flat sub-sidewall is parallel to a surface of the bottom to function as an intermediate platform, and two steps are formed on the entire sidewall as a single piece.

3. The pixel definition layer according to claim 2, wherein the first flat sub-sidewall and the third flat sub-sidewall have a same inclination with respect to the surface of the bottom.

4. The pixel definition layer according to claim 2, wherein the plurality of recessed parts comprise at least one repetitive unit, each of which comprises at least the first recessed part, the second recessed part and a third recessed part, and the first recessed part is different from the second recessed part and the third recessed part,
the entire sidewalls, as a single piece, of the first recessed part, the second recessed part and the third recessed part have a same height in a direction vertical to the surface of the bottom, and
the entire sidewalls, as a single piece, of the second recessed part and the third recessed part each are provided with the position-limiting structure.

5. The pixel definition layer according to claim 4, wherein a height difference in the direction vertical to the surface of the bottom between the second flat sub-sidewall of the second recessed part and the surface of the bottom is equal to a height difference in the direction vertical to the surface of the bottom between the second flat sub-sidewall of the third recessed part and the surface of the bottom.

6. The pixel definition layer according to claim 5, wherein each of the height differences in the direction vertical to the surface of the bottom between the second flat sub-sidewall of the second recessed part and the surface of the bottom and the height difference in the direction vertical to the surface of the bottom between the second flat sub-sidewall of the third recessed part and the surface of the bottom is 1 µm.

7. The pixel definition layer according to claim 6, wherein the entire sidewall of the first recessed part has a height of 1.5 µm in the direction vertical to the surface of the bottom.

8. The pixel definition layer according to claim 4, wherein a height difference in the direction vertical to the surface of the bottom between the second flat sub-sidewall of the second recessed part and the surface of the bottom is greater than a height difference in the direction vertical to the surface of the bottom between the second flat sub-sidewall of the third recessed part and the surface of the bottom.

9. The pixel definition layer according to claim 4, wherein the entire sidewall of the first recessed part is provided with the position-limiting structure, and a height difference in the direction vertical to the surface of the bottom between the second flat sub-sidewall of the first recessed part and the surface of the bottom is greater than a height difference in the direction vertical to the surface of the bottom between the second flat sub-sidewall of the second recessed part and the surface of the bottom, and/or
a height difference in the direction vertical to the surface of the bottom between the second flat sub-sidewall of the second recessed part and the surface of the bottom is greater than a height difference in the direction vertical to the surface of the bottom between the second flat sub-sidewall of the third recessed part and the surface of the bottom.

10. The pixel definition layer according to claim 1, wherein an included angle between the surface of the bottom and the entire sidewall is an acute angle.

11. An array substrate, comprising a substrate and a pixel definition layer, as a single layer, for defining a plurality of light emitting devices, provided on the substrate, wherein, the pixel definition layer comprises a plurality of recessed parts arranged in an array, each of which comprising a bottom and an entire sidewall extending upwards from the bottom to an upper surface of the pixel definition layer,
at least two recessed parts of the plurality of recessed parts are different from each other to accommodate light emitting device of different colors respectively,
the entire sidewall of at least one of at least two recessed parts has a position-limiting structure on the entire sidewall; and
the position-limiting structure comprises a bottom inflexion point at a junction of the bottom and the entire sidewall, and a first inflexion point and a second inflexion point on the entire sidewall, and the bottom inflexion point is lower than the first inflexion point, and the first inflexion point is lower than the second inflexion point relative to the bottom or the first inflexion point is at a same height as the second inflexion point relative to the bottom,
the first inflexion point and the second inflexion point divide the entire sidewall into a first flat sub-sidewall extending upwards from the bottom to the first inflexion point, a second flat sub-sidewall extending from the first inflexion point to the second inflexion point, and a third flat sub-sidewall extending upwards from the second inflexion point to the upper surface of the pixel definition layer, a first obtuse inner angle is formed between the first flat sub-sidewall and the second flat sub-sidewall, and a second obtuse inner angle is formed between the second flat sub-sidewall and the third flat sub-sidewall, and
the at least one of the plurality of recessed parts is provided with a light emitting device therein, and a plurality of functional layers of the light emitting device is provided in the recessed part and below the first inflexion point, and the plurality of functional layers comprise a hole injection layer, a hole transport layer, a light emitting layer, an electron transport layer and an electron injection layer; and
orthographic projections of the first flat sub-sidewall and the second flat sub-sidewall on a plane, which includes the bottom of the recess, are jointed at a first jointing line, and orthographic projections of the second flat sub-sidewall and the third flat sub-sidewall on the plane are jointed at a second jointing line, and the first jointing line is separated from the second jointing line;
an upper surface of the plurality of functional layer is flush with the first inflexion point, all the plurality of functional layers of the light emitting devices of different colors are all limited in the plurality of recessed parts, respectively, and lower surface of the plurality of functional layers of the light emitting devices of different colors are respectively in direct contact with the bottoms of the plurality of recessed parts, these bottoms are at a same height, and all the upper surfaces of the plurality of functional layers of the light emitting devices of different colors are at different heights; and
the at least two recessed parts for accommodating light emitting devices of different colors comprise a first recessed part which is not provided with the position-limiting structure on its entire sidewall and its entire sidewall is a flat sidewall extending from the bottom to the upper surface and an upper surface of the functional layers of the light emitting device in the first recessed part is flush with the upper surface of the pixel definition layer, and a second recessed part which is provided with the position-limiting structure on its entire sidewall, and the first inflexion point of the first second recessed part is lower than the upper surface.

12. The array substrate according to claim 11, wherein the first inflexion point is at a same height as the second inflexion point relative to the bottom, the second flat sub-sidewall is parallel to a surface of the bottom to function as an intermediate platform, and two steps are formed on the entire sidewall as a single piece.

13. The array substrate according to claim 12, wherein the plurality of recessed parts comprise at least one repetitive unit, each of which comprises at least the first recessed part, the second recessed part and a third recessed part, and a red light emitting device, a green light emitting device, and a blue light emitting device are provided in the first recessed part, the second recessed part and the third recessed part, respectively, the first recessed part, the second recessed part and the third recessed part are different from each other, the entire sidewalls, as a single piece, of the first recessed part, the second recessed part and the third recessed part have a same height in a direction vertical to the surface of the bottom, the first recessed part, the second recessed part, and the third recessed part, where the red light emitting device, the green light emitting device, and the blue light emitting device are respectively located, each are provided with the position-limiting structure, and a height difference in the direction vertical to the surface of the bottom between the second flat sub-sidewall of the recessed part corresponding to the blue light emitting device and the surface of the bottom is lower than a height difference in the direction vertical to the surface of the bottom between the second flat sub-sidewall of the recessed part corresponding to the green light emitting device, and a height difference in the direction vertical to the surface of the bottom between the second flat sub-sidewall of the recessed part corresponding to the red light emitting device and the bottom surface is higher than the height difference in the direction vertical to the surface of the bottom between the second flat sub-sidewall of the recessed part corresponding to the green light emitting device; or the second recessed part and the third recessed part, where the green light emitting device and the blue light emitting device are respectively located, each are provided with the position-limiting structure, and the first recessed part, where the red light emitting device is located, is not provided with the position-limiting structure, and a height difference in the direction vertical to the surface of the bottom between the second flat sub-sidewall of the recessed part corresponding to the blue light emitting device and the surface of the bottom is smaller than or equal to a height difference in the direction vertical to the surface of the bottom between the second flat sub-sidewall-of the recessed part corresponding to the green light emitting device and the surface of the bottom.

14. The array substrate according to claim 13, wherein each of the red light emitting device, the green light emitting device and the blue light emitting device comprises a first electrode, the plurality of functional layers in the recessed part and a second electrode.

15. The array substrate according to claim 14, wherein the plurality of functional layers of each of the red light emitting device, the green light emitting device and the blue light emitting device are all provided below the position-limiting structure in the recessed part.

16. The array substrate according to claim 15, wherein a thickness of the hole transport layer of the red light emitting device is greater than a thickness of the hole transport layer of the green light emitting device, and a thickness of the hole transport layer of the green light emitting device is greater than a thickness of the hole transport layer of the blue light emitting device.

17. The array substrate according to claim 16, wherein a thickness of the light emitting layer of the red light emitting device is greater than a thickness of the light emitting layer of the green light emitting device, and a thickness of the light emitting layer of the green light emitting device is greater than a thickness of the light emitting layer of the blue light emitting device.

18. The array substrate according to claim 14, wherein an upper surface of the plurality of functional layers of the green light emitting device is flush with the intermediate platform of the recessed part for the green light emitting device, and an upper surface of the plurality of functional layers of the blue light emitting device is flush with the intermediate platform of the recessed part for the blue light emitting device, wherein an upper surface of the plurality of functional layers of the red light emitting device is flush with the upper surface of the pixel definition layer.

19. The array substrate according to claim 18, wherein a second electrode, as a single piece, is formed on the upper surface of the plurality of functional layers of the green light emitting device, the upper surface of the plurality of functional layers of the blue light emitting device, the upper surface of the plurality of functional layers of the red light emitting device, and the upper surface of the pixel definition layer.

20. A display panel, comprising the array substrate according to claim 12.

* * * * *